United States Patent [19]

Yamauchi et al.

[11] Patent Number: 5,075,888
[45] Date of Patent: Dec. 24, 1991

[54] SEMICONDUCTOR MEMORY DEVICE HAVING A VOLATILE MEMORY DEVICE AND A NON-VOLATILE MEMORY DEVICE

[75] Inventors: Yoshimitsu Yamauchi; Kenichi Tanaka, both of Nara; Keizo Sakiyama, Kashihara, all of Japan

[73] Assignee: Sharp Kabushiki Kaisha, Osaka, Japan

[21] Appl. No.: 308,854

[22] Filed: Feb. 9, 1989

[30] Foreign Application Priority Data

| Jan. 9, 1988 | [JP] | Japan | 63-28511 |
| Jun. 24, 1988 | [JP] | Japan | 63-157078 |
| Jul. 14, 1988 | [JP] | Japan | 63-175774 |
| Jul. 14, 1988 | [JP] | Japan | 63-175775 |
| Aug. 24, 1988 | [JP] | Japan | 63-210142 |

[51] Int. Cl.$^5$ ............................................. G11C 11/40
[52] U.S. Cl. .................................. 365/228; 365/149; 365/185; 357/23.5
[58] Field of Search ............... 365/149, 185, 184, 182, 365/228; 357/23.5, 23.6

[56] References Cited

U.S. PATENT DOCUMENTS

| 4,615,020 | 9/1986 | Rinerson et al. | 365/184 |
| 4,672,580 | 6/1987 | Yau et al. | 365/185 |
| 4,721,987 | 1/1988 | Baglee et al. | 357/23.6 |
| 4,760,556 | 7/1988 | Deguchi et al. | 365/149 |
| 4,786,954 | 11/1988 | Movie et al. | 365/149 |
| 4,813,018 | 3/1989 | Kobayashi et al. | 365/203 |

OTHER PUBLICATIONS

"A New Architecture for the NVRAM-An EEPROM Backed-Up Dynamic RAM" by Yasushi Terada et al., IEEE Journal of Solid-State Circuits, vol. 23, No. 1, 2/88, pp. 86-90.

Primary Examiner—Aristotelis Psitos
Assistant Examiner—Alfonso Garcia
Attorney, Agent, or Firm—Morrison & Foerster

[57] ABSTRACT

A semiconductor memory device composed of a DRAM, an EEPROM, a mode switch means for selecting either mode of the DRAM mode and the EEPROM mode, and a transfer means for transferring data stored in the DRAM to the EEPROM and vice versa. The DRAM consists of one transistor and one capacitor, and one of the terminals of the capacitor is electrically isolated.

4 Claims, 3 Drawing Sheets

FIG. 5
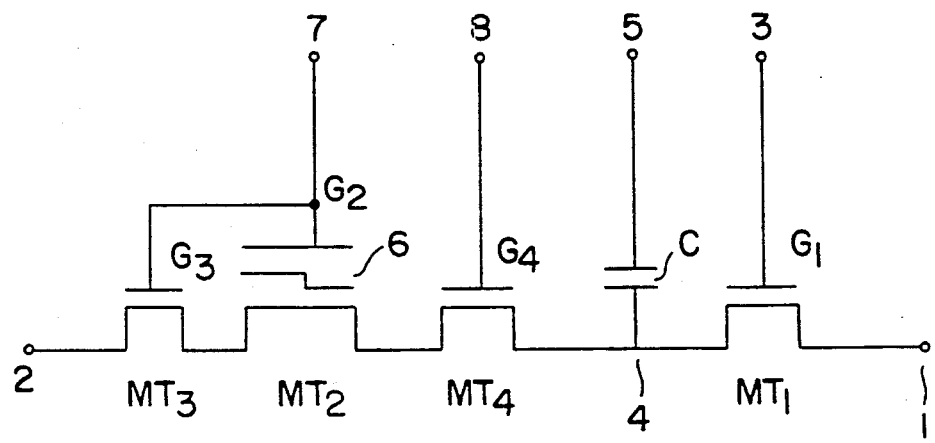
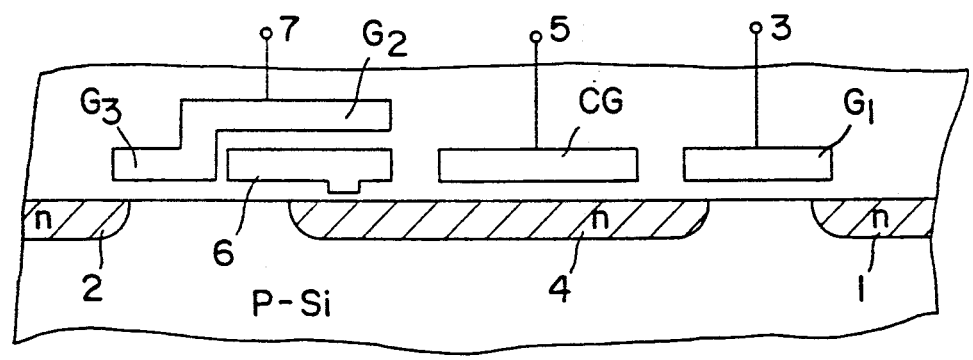
FIG. 9

FIG. 6
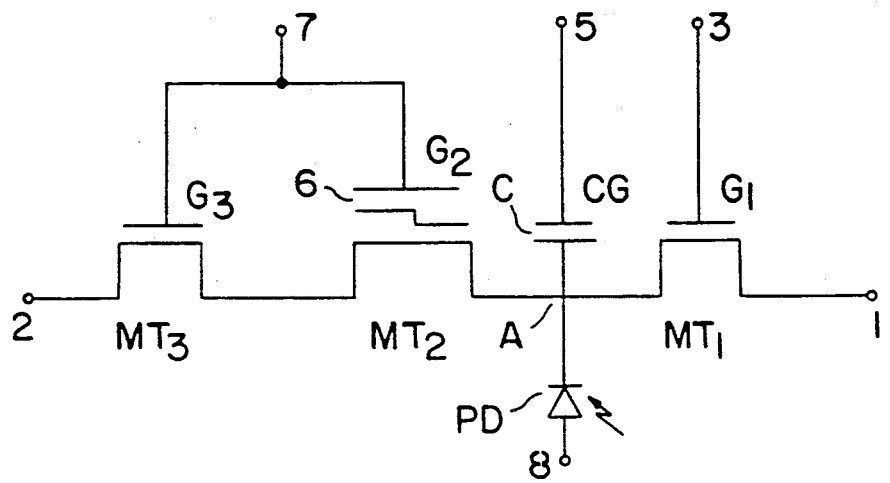
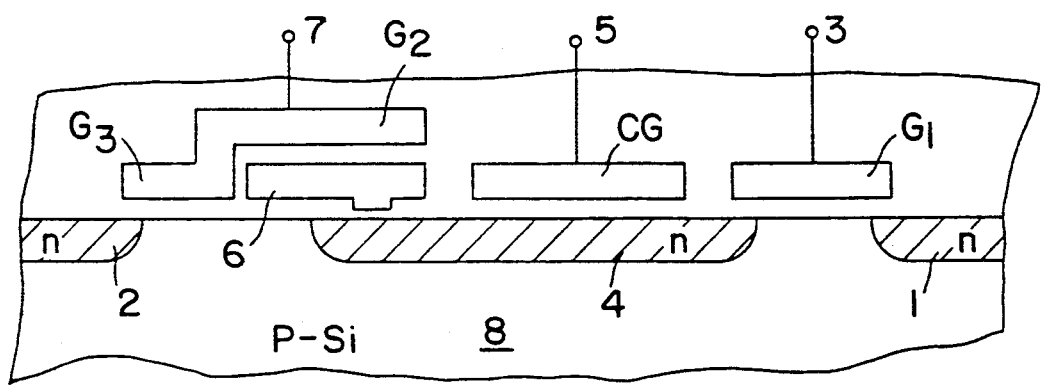
FIG. 7
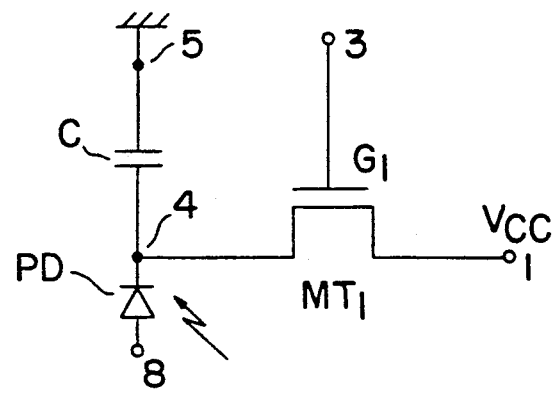
FIG. 8

SEMICONDUCTOR MEMORY DEVICE HAVING A VOLATILE MEMORY DEVICE AND A NON-VOLATILE MEMORY DEVICE

BACKGROUND OF THE INVENTION

This invention relates to a semiconductor memory device, more particularly to a semiconductor memory device in which a volatile memory means and a non-volatile memory means are combined.

1. Field of the invention

Generally, a memory device which can retain data in the absence of power is called "a non-volatile memory device", and that which cannot retain data in the event of power removal is called "a volatile memory device". Both of these volatile and non-volatile memory devices can be constructed as a semiconductor device. Such semiconductor memory devices include those in which data can be electrically written and erased. So-called EEPROM and RAM exemplify a non-volatile memory device and a volatile memory device, respectively.

An EEPROM can retain data for a long time even when powered off, but has drawbacks that the number of rewriting data is restricted within a prefixed value, and that it requires several msecs. to conduct one data rewriting operation. Hence, an EEPROM is not suitable for the use in which data are rewritten frequently.

In a RAM including a DRAM, each data rewriting operation requires a short period of time (e.g., about 100 nsecs.), and the number of rewriting data is not restricted. But, a RAM cannot retain data when powered off.

To overcome these drawbacks of a conventional memory device, it has been proposed to combine an EEPROM with a DRAM by Y. TERADA et al (IEEE J. OF SOLID-STATE CIRCUITS, VOL. 23, NO. 1, FEB. 1988). In the proposed memory device, data can be transferred in a memory cell between an EEPROM portion and a DRAM portion. However, the proposed memory device has a relatively large size because the DRAM portion in each memory cell consists of two transistors and one capacitor.

In the proposed memory device, moreover, both terminals of the capacitor are connected to the control gate of a transistor of the EEPROM, resulting in that only the data stored in memory cells which are connected to the same word line can be transferred at a time, requiring a prolonged time for the data transfer.

In such a memory device wherein an EEPROM and a DRAM are combined, the EEPROM is directly connected with the DRAM. Such a configuration has a possibility that data once stored in the EEPROM may be destroyed when the DRAM is operated.

Recently, semiconductor optical sensors such as a CCD are widely used for converting optical signals into electric signals. Electric signals generated in such an optical sensor must be immediately conveyed to a suitable process means. In other words, a conventional optical sensor cannot store data produced therein.

SUMMARY OF THE INVENTION

The semiconductor memory device of this invention, which overcomes the above-discussed and numerous other disadvantages and deficiencies of the prior art, comprises a volatile memory means; a non-volatile memory means; a mode switch means for selecting either mode of a volatile memory mode in which said memory device functions as a volatile memory device and a non-volatile memory mode in which said memory device functions as a non-volatile memory device; and a transfer means for transferring data stored in said volatile memory means to said non-volatile memory means, the improvement existing in that said volatile means consists of one transistor and one capacitor, and one of the terminals of said capacitor is electrically isolated from said non-volatile memory means.

The semiconductor memory device comprises a volatile memory means; a non-volatile memory means; a mode switch means for selecting either mode of a volatile memory mode in which said memory device functions as a volatile memory device and a non-volatile memory mode in which said memory device functions as a non-volatile memory device; and a transfer means for transferring data stored in said non-volatile memory means to said volatile memory means, the improvement existing in that said volatile means consists of one transistor and one capacitor, and one of the terminals of said capacitor is electrically isolated from said non-volatile memory means.

The semiconductor memory device comprises a volatile memory means; a non-volatile memory means; a mode switch means for selecting either mode of a volatile memory mode in which said memory device functions as a volatile memory device and a non-volatile memory mode in which said memory device functions as a non-volatile memory device; and a transfer means for transferring data stored in said volatile memory means to said non-volatile memory means and for transferring data stored in said non-volatile memory means to said volatile memory means, the improvement existing in that said volatile means consists of one transistor and one capacitor, and one of the terminals of said capacitor is electrically isolated from said non-volatile memory means.

The semiconductor memory device comprises a volatile memory means; a non-volatile memory means; a mode switch means for selecting either mode of a volatile memory mode in which said memory device functions as a volatile memory device and a non-volatile memory mode in which said memory device functions as a non-volatile memory device; and a transfer means for transferring data between said volatile memory means and said non-volatile memory means in accordance with the mode selected by said switch means, the improvement existing in that an isolation means for electrically isolating said non volatile memory means from said volatile memory means is disposed therebetween.

The semiconductor memory device comprises a volatile memory means; a non-volatile memory means; a mode switch means for selecting either mode of a volatile memory mode in which said memory device functions as a volatile memory device and a non-volatile memory mode in which said memory device functions as a non-volatile memory device; and a transfer means for transferring data between said volatile memory means and said non-volatile memory means in accordance with the mode selected by said switch means, the improvement existing in that said memory device further comprises a photoelectric conversion means for converting an optical signal applied thereon into an electric signal, said electric signal being stored in said volatile memory means.

The semiconductor memory device comprises a volatile memory means; a non-volatile memory means; a mode switch means for selecting either mode of a volatile memory mode in which said memory device functions as a volatile memory device and a non-volatile memory mode in which said memory device functions as a non-volatile memory device; and a transfer means for transferring data between said volatile memory means and said non-volatile memory means in accordance with the mode selected by said switch means, the improvement existing in that said non-volatile memory means comprises a first MOS transistor having a floating galte and a control gate, and said mode switch means comprises a second MOS transistor, said control gate of said first MOS transistor and the control gate of said second MOS Thus, the invention described herein makes possible the objectives of (1) providing a semiconductor memory device in which data can be rewritten repeatedly without restriction; (2) providing a semiconductor memory device in which the data rewriting operation can be performed rapidly; (3) providing a semiconductor memory device in which data can be retained in the absence of power supply; (4) providing a semiconductor memory device which can be constructed in a reduced size; (5) providing a semiconductor memory device which can be constructed in a small number of elements; (6) providing a semiconductor memory device in which all stored data can be transferred at a time between a non-volatile memory means and a volatile memory means; (7) providing a semiconductor memory device in which the non-volatile memory means can be isolated from the volatile memory means when the volatile memory means is operated; (8) providing a semiconductor memory device in which data stored in the non-volatile memory means is prevented from being destroyed; and (9) providing a semiconductor memory device which can convert optical signals into electric signals, and can store the electric signals as data.

BRIEF DESCRIPTION OF THE DRAWINGS

This invention may be better understood and its numerous objects and advantages will become apparent to those skilled in the art by reference to the accompanying drawings as follows:

FIG. 5 shows an equivalent circuit of another example of the memory device of the invention.

FIG. 6 shows an equivalent circuit of a further example of the memory device of the invention.

FIG. 7 illustrates a partial sectional view of the memory device of FIG. 6.

FIG. 8 shows an equivalent circuit of the memory device of FIG. 6 at the state wherein data generated in the photodiode is stored in the DRAM.

FIG. 9 illustrates a partial sectional view of a further example of the memory device of the invention.

DESCRIPTION OF THE PREFERRED EMBODIMENTS

EXAMPLE 1

Figure 1:
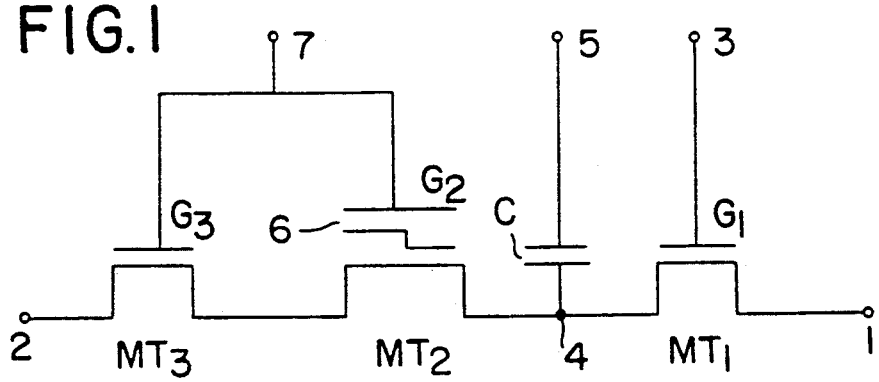
FIG. 1 shows an equivalent circuit of an example of the memory device of the invention.

FIG. 1 illustrates an equivalent circuit of an example of the semiconductor memory device according to the invention. The memory device shown in FIG. 1 comprises an EEPROM which functions as a non-volatile memory means, and a DRAM which is a volatile memory means. Both EEPROM and DRAM are easily manufactured by a conventional MOS technique. A DRAM has an advantage in that a memory cell can be constructed by a small number of elements.

In the memory device shown in FIG. 1, three MOS transistors $MT_1$, $MT_2$ and $MT_3$ are arranged in series on a semiconductor substrate. In an actual memory device, many combinations of MOS transistors identical to this arrangement are formed on a substrate. To simplify the explanation, only one combination of MOS transistors which functions as one memory cell is shown in FIG. 1. A capacitor C is connected to the intermediate portion 4 between the MOS transistors $MT_1$ and $MT_2$. To a terminal 5 of the capacitor C, a predetermined voltage can be applied. A terminal 1 of the MOS transistor $MT_1$, which is an n-diffusion layer of the substrate, is connected to a column line of the memory device. The MOS transistor $MT_2$ comprising a floating gate 6 disposed under the control gate $G_2$ constitutes an EEPROM. The MOS transistor $MT_3$ functions as a mode switch transistor by which the operating mode of this memory device is switched over between the EEPROM mode and the DRAM mode. The gate $G_3$ of the MOS transistor $MT_3$ and the gate $G_2$ of the MOS transistor $MT_2$ are connected to a terminal 7 through which a voltage can be applied to both the gates $MT_2$ and $MT_3$. A terminal 2 of the MOS transistor $MT_3$ is another n-diffusion layer in the substrate. Either one of the terminals 1 and 2 acts as a drain terminal, and the other one acts as a source terminal. In this embodiment, one of the electrodes of the capacitor C is the diffusion layer in the substrate, and the other one is a polysilicon layer which is disposed above the diffusion layer through an oxide film.

The operation of the memory device having such a configuration will be described.

(1) Initialization

Before operating the memory device, a positive voltage is applied to the terminal 7 so that the floating gate 6 is charged (the accumulated charge at this stage is denoted by $Q_F$).

(2) DRAM mode

Figure 2:
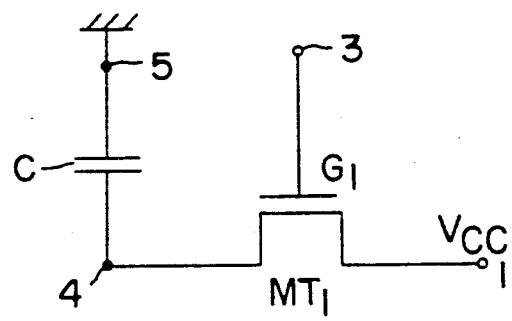
FIG. 2 shows an equivalent circuit of the memory device of FIG. 1 at the DRAM mode.

When the memory device is to be operated in the same manner as a conventional DRAM, the terminals 5 and 7 are grounded to make the MOS transistor $MT_3$ off. The equivalent circuit diagram of the memory device at this stage, which is shown in FIG. 2, constitutes a DRAM comprising one capacitor and one MOS transistor. When the MOS transistor $MT_1$ is turned off while applying the voltage $V_{CC}$ to the terminal 1 (i.e., a drain) of the transistor, the charge $Q_C$ accumulated in the capacitor C (the capacity of which is denoted by $C_C$) becomes $$Q_C = C_C V_{CC}$$

(3) Transfer of data from DRAM to EEPROM

Figure 3:
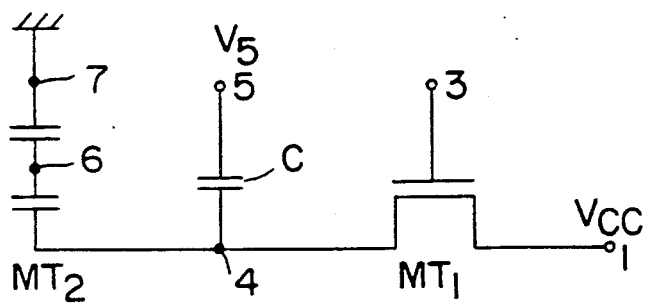
FIG. 3 shows an equivalent circuit of the memory device of FIG. 1 at the state in which data are transferred from a DRAM to an EEPROM.

When transferring the data stored in the DRAM to the EEPROM, the equivalent circuit becomes as shown in FIG. 3.

When a voltage $V_5$ is applied to the terminal 5 while a charge $Q_C$ is accumulated in the capacitor C and a charge QF is accumulated in the floating gate 6, the following relations are given, $$C_L(V_F - V_4) + C_H V_F = Q_F \quad (1)$$

$$C_C(V_4 - V_5) + C_L(V_4 - V_F) = Q_C \quad (2)$$

where, $C_L$: capacity between the floating gate 6 and the substrate;

$C_H$: capacity between the floating gate 6 and the control gate $G_2$;

$V_4$: potential of the portion 4;

$V_5$: potential of the terminal 5;

$V_F$: potential of the floating gate 6;

From equations (1) and (2), the voltage V which is applied across the floating gate 6 and the diffusion layer consisting one of the electrodes of the capacitor C can be expressed as follows:

$$V = V_4 - V_F$$
$$= \frac{C_H C_C V_5}{(C_L + C_H)C_C + C_L C_H} + \frac{C_H Q_C}{(C_L + C_H)C_C + C_L C_H} - \frac{C_C Q_F}{(C_L + C_H)C_C + C_L C_H} \quad (3)$$

The threshold voltage of the MOS transistor, $MT_2$ is shifted by the charge accumulated in the floating gate 6 at the initialization. If the amount of the shift is denoted as $\Delta V_{TH}$, the charge $Q_F$ accumulated at the initialization can be expressed as $$Q_F = -C_H \cdot \Delta V_{TH} \quad (4)$$

When a voltage $V_{CC}$ is applied to the capacitor C, the charge $Q_C$ of the capacitor C is $$Q_C = C_C V_{CC} \quad (5)$$

From equations (3), (4) and (5), the voltage V can be expressed as $$V = \frac{C_H C_C}{(C_L + C_H)C_C + C_L C_H}(V_5 + V_{CC} + \Delta V_{TH}) \quad (6)$$

The density $J_F$ of the current injected to the floating gate 6 depends on the strength of the electric field $E_{OX}$ generated between the floating gate 6 and the diffusion layer of the substrate, as follows:

$$J_F = A \cdot E_{OX}^2 \exp(-B/E_{OX}) \quad (7)$$

where A and B are constant.

When the thickness of the thin oxidized film between the floating gate 6 and the diffusion layer is denoted as $t_{OX}$, the electric field $E_{OX}$ can be expressed as $$E_{OX} = \frac{V}{t_{OX}} \quad (8)$$
$$= \frac{1}{t_{OX}} \frac{C_H C_C}{(C_L + C_H)C_C + C_L C_H}(V_5 + V_{CC} + \Delta V_{TH})$$

The electric field $E_{OX}$ at the state wherein the charge $Q_C = C_C V_{CC}$ is accumulated in the capacitor C is denoted as $E_{OX1}$, and the electric field $E_{OX}$ at the state wherein no charge is accumulated in the capacitor C (i.e., $Q_C = 0$) is denoted as $E_{OX0}$. The difference $\Delta E_{OX}$ between $E_{OX1}$ and $E_{OX0}$ can be expressed as:

$$\Delta E_{OX} = E_{OX1} - E_{OX0} \quad (9)$$
$$= \frac{V_{CC}}{t_{OX}} \frac{C_H C_C}{(C_L + C_H)C_C + C_L C_H}$$

Figure 4:
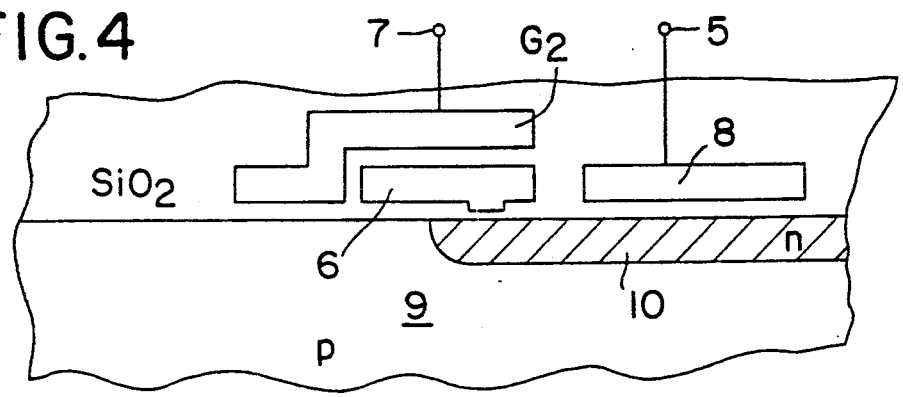
FIG. 4 illustrates a partial sectional view of the memory device of FIG. 1.

FIG. 4 shows a partial cross sectional view of the device for illustrating the capacitor C and the MOS transistor $MT_2$. The voltage $V_5$ is applied to the terminal 5 connected to the electrode 8 of the capacitor C, to inject holes into the floating gate 6. When the charge $Q_C = C_C V_{CC}$ is accumulated in the capacitor C, holes are injected by the electric field which is stronger than that generated when no charge is accumulated in the capacitor, by $E_{OX}$ obtained by equation (9).

As shown in FIG. 4, the surface of the semiconductor substrate 9 is covered with an oxidized film so that the gate $G_2$, the floating gate 6, the electrode 8, etc. are covered with the film. An n-type diffusion layer 10 is formed in the surface portion of the substrate 9 under the floating gate 6 and electrode 8.

In this example, $t_{OX} = b$ 80Å, $C_C = 50$fF, $C_H = 15.8$fF, $C_L = 9.2$fF, and $V_{CC} = 5$V. Substitution of these values into the equation (9) gives $$\Delta E_{OX} = 3.54 \text{ (MV/cm)}$$

The ratio of the current density $J_{F1}$ when the electric field $E_{OX}$ is $E_{OX1}$ to the current density $J_{OF}$ when the electric field $E_{OX}$ is $E_{OX0}$ is about $10^7$, i.e., $$J_{F1}/J_{F0} = 10^7$$

This means that in the floating gate 6 a greater amount of positive charges are accumulated when the capacitor C is charged ($Q_C = C_C V_{CC}$) than when the capacitor C is not charged ($Q_C 0$).

In the above description, the voltage $V_5$ is applied to one of the terminals of the capacitor C while the control gate $G_2$ is grounded. The same process as the above can be conducted even when a voltage is applied to the terminal 7 while the one terminal of the capacitor C is grounded.

As described above, the data accumulated in the capacitor C can be transferred to the floating gate 6 by applying a voltage to either of the terminals 5 and 7. Even when a plurality of the above-mentioned devices are connected to form a large-scaled memory device, a large amount of data stored in all of DRAM portions can be rapidly transferred at a time to EEPROM portions. The data in an EEPROM portion can be detected on the basis of the degree of the channel current of the MOS transistor $MT_2$ or the change in the gate threshold voltage as seen from the control gate $G_2$.

EXAMPLE 2

The memory device of this example can be constructed in the same manner as the memory device of Example 1. In the device of this example, the data stored at the floating gate 6 of the MOS transistor $MT_2$ constituting an EEPROM can be transferred to the capacitor C constituting a DRAM in the following way.

(1) Initialization and DRAM mode

The operation of the memory device of this example in the initialization is the same as that of the device of Example 1.

(2) Transfer of data from EEPROM to DRAM

When positive charges are accumulated in the floating gate 6 of the MOS transistor $MT_2$, the threshold voltage $V_{TH}$ of the MOS transistor $MT_2$ is given as $$V_{TH} = V_{TH0} - \frac{Q_F}{C_H}$$

where $V_{TH0}$ denotes the threshold voltage of the MOS transistor $MT_2$ in the initialized state, $Q_F$ denotes a positive charge accumulated in the floating gate 6, and $C_H$ denotes the capacity between the floating gate 6 and the control gate $G_2$. Namely, when the floating gate 6 is positively charged, the threshold voltage $V_{TH}$ of the MOS transistor $MT_2$ is lower than that at the initialization.

When the terminals 1, 3 and 5 are grounded and an appropriate voltage is applied to the terminal 7, the MOS transistor $MT_2$ is turned on under the condition that positive charges are accumulated in the floating gate 6, and the MOS transistor $MT_2$ is turned off under the condition that no positive charges are accumulated in the floating gate 6 (or negative charges are accumulated in the floating gate 6).

Under the condition that terminals 1, 3 and 5 are grounded and the voltage $V_{CC}$ is applied to the terminal 2, positive charges can be accumulated in the diffusion layer 4, which functions as one of the electrodes of the capacitor C, by applying a positive voltage to the terminal 7 only when positive charges are accumulated in the floating gate 6. Therefore, the memory device of this example can operate as a DRAM by applying a voltage to the MOS transistor $MT_1$. It will be apparent for those skilled in the art that, when Examples 1 and 2 are combined, data can be transferred from the EEPROM to the DRAM or from the DRAM to the EEPROM.

EXAMPLE 3

FIG. 5 illustrates an equivalent circuit of another example of the semiconductor memory device according to the invention. The memory device of FIG. 4 is constructed in the same manner as that shown in FIG. 1 except that a MOS transistor $MT_4$ is disposed between the capacitor C constituting a DRAM and the MOS transistor $MT_2$ constituting an EEPROM. The way of operating the MOS transistor $MT_4$ will be described. The other components of this memory device operate in the substantially same way as those of the device shown in FIG. 1, and therefore their explanation will be omitted.

(1) Initialization

The MOS transistors $MT_1$ and $MT_4$ are turned on, and then a positive voltage is applied to the terminal 7 so that the floating gate 6 is charged.

(2) DRAM mode

When the memory device is to be operated as a DRAM, the terminal 7 is grounded to turn the MOS transistor $MT_4$ off. The equivalent circuit diagram of the memory device at this mode is the same as that shown in FIG. 2.

(3) Transfer of data from DRAM to EEPROM

When transferring the data stored in the DRAM to the EEPROM, the MOS transistor $MT_4$ is turned on, and the MOS transistor $MT_1$ is turned off, the equivalent circuit diagram at this mode is the same as that shown in FIG. 3.

In this example, the MOS transistor $MT_2$ constituting the EEPROM is electrically isolated during the DRAM mode from the capacitor C constituting the DRAM, by the MOS transistor $MT_4$. Accordingly, the data stored in the EEPROM will not be damaged or destroyed even when the memory device is set to the DRAM mode, resulting in providing an excellently reliable semiconductor memory device.

EXAMPLE 4

FIG. 6 illustrates an equivalent circuit of another example of the semiconductor memory device according to the invention. A cross sectional view of this example is shown in FIG. 7. In this example, a pn junction photodiode PD is formed between the n-diffusion region 4 and the p-Si substrate 8. The operation of the device of this example will be described.

(1) Initialization

Before operating the memory device, a positive voltage is applied to the terminal 7 so that the floating gate 6 is charged (the accumulated charge at this stage is denoted by $Q_F$).

Prior to the irradiation of the photodiode PD, positive charges are accumulated in the n-diffusion region 4 of the photodiode PD (the data stored in the DRAM is "1"). This is conducted in the following manner. First, the terminals 5 and 7 are grounded to make the MOS transistor $MT_3$ off. Then, the MOS transistor $MT_1$ is turned on while the voltage $V_{cc}$ is applied to the drain terminal 1 of the transistor $MT_1$. The charge $Q_C$ accumulated in the capacitor C (the capacity of which is $C_C$) is given as $$Q_C = C_C V_{cc}$$

(2) Irradiation of photodiode

When the photodiode PD is irradiated by a light beam, electrons (minority carrier) generate in the p-Si substrate 8 and move to the n-diffusion layer 4 wherein electrons recombine with holes which have been accumulated in the initialization, resulting in that there is no positive charge in the n-diffusion region 4 (the data stored in the DRAM is "0"). In this way, the data stored in the DRAM can be changed from "1" to "0", i.e., optical signals can be converted into electric signals by irradiating the photodiode. FIG. 8 is an equivalent circuit diagram at this stage.

(3) Transfer of data from DRAM to EEPROM

When data stored in the DRAM are transferred to the EEPROM, the equivalent circuit of the memory device of this example becomes as shown in FIG. 1. Data corresponding to optical signals impinged on the photodiode can be transferred from the DRAM to the EEPROM in the same manner as in Example 1. Namely, according to the invention, optical signals can be stored in the form of electric signals without requiring a battery backup system.

EXAMPLE 5

FIG. 9 is a cross sectional view of an example of the memory device of the invention. The equivalent circuit of the memory device of FIG. 8 is the same as that shown in FIG. 1. The control gate $G_3$ of the MOS transistor $MT_3$ which acts as the mode switch means is disposed on the channel region of the p-Si substrate through an oxidized film. The control gate $G_2$ of the MOS transistor $MT_2$ is disposed above the floating gate 6 which extends over the diffusion region 4 and the channel region as shown in FIG. 8. Both the gates $G_2$ and $G_3$ are made of polysilicon, and they are integrally formed, resulting in the reduced size of the memory device.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor memory device comprising: volatile memory means; a non-volatile memory means; a mode switch means for selecting either mode of a volatile memory mode in which said memory device functions as a volatile memory device and a non-volatile memory mode in which said memory device functions as a non-volatile memory device; and a transfer means for transferring data stored in said volatile memory means to said non-volatile memory means, the improvement existing in that said volatile memory means consists of one transistor and one capacitor, and one of the terminals of said capacitor is electrically isolated from said non-volatile memory means and electrically coupled to a terminal to which one of a plurality of predetermined voltages is applied.

2. In a semiconductor memory device comprising: a volatile memory means; a non-volatile memory means; a mode switch means for selecting either mode of a volatile memory mode in which said memory device functions as a volatile memory device and a non-volatile memory mode in which said memory device functions as a non-volatile memory device; and a transfer means for transferring data stored in said non-volatile memory means to said volatile memory means, the improvement existing in that said volatile means consists of one transistor and one capacitor, and one of the terminals of said capacitor is electrically isolated from said non-volatile memory means and electrically coupled to a terminal to which one of a plurality of predetermined voltages is applied.

3. In a semiconductor memory device comprising: a volatile memory means; a non-volatile memory means; a mode switch means for selecting either mode of a volatile memory mode in which said memory device functions as a volatile memory device and a non-volatile memory mode in which said memory device functions as a non-volatile memory device; and a transfer means for transferring data stored in said volatile memory means to said non-volatile memory means and for transferring data stored in said non-volatile memory means to said volatile memory means, the improvement existing in that said volatile means consists of one transistor and one capacitor, and one of the terminals of said capacitor is electrically isolated from said non-volatile memory means and electrically coupled to a terminal to which one of a plurality of predetermined voltages is applied.

4. In a semiconductor memory device comprising: a volatile memory means; a non-volatile memory means; a mode switch means for selecting either mode of a volatile memory mode in which said memory device functions as a volatile memory device and a non-volatile memory mode in which said memory device functions as a non-volatile memory device; and a transfer means for transferring data between said volatile memory means and said non-volatile memory means in accordance with the mode selected by said switch means, the improvement existing in that said volatile memory means consists of one transistor and one capacitor, and an isolation means for electrically isolating said non volatile memory means from said volatile memory means is disposed therebetween and electrically coupled to a terminal to which one of a plurality of predetermined voltages is applied.

* * * * *